United States Patent [19]

Herren

[11] 4,420,739
[45] Dec. 13, 1983

[54] LIQUID-COOLED ELECTRICAL ASSEMBLY

[76] Inventor: Peter Herren, Kirschbaumweg 11, 2563 Ipsach, Switzerland

[21] Appl. No.: 297,630

[22] Filed: Aug. 31, 1981

[30] Foreign Application Priority Data

Sep. 15, 1980 [CH] Switzerland .................... 6888/80

[51] Int. Cl.³ ............................................. H01C 1/08
[52] U.S. Cl. .......................................... 338/53; 338/55
[58] Field of Search .................................... 338/53–55; 357/85; 165/80 A, 166; 219/299, 298

[56] References Cited

U.S. PATENT DOCUMENTS

| | | | |
|---|---|---|---|
| 2,501,331 | 3/1950 | Hein | 35/782 |
| 3,075,360 | 1/1963 | Elfving et al. | 165/80 A |
| 3,300,746 | 1/1967 | Franz | 338/55 |
| 4,268,850 | 5/1981 | Lazarek et al. | 357/82 |
| 4,322,737 | 3/1982 | Sliva, Jr. | 357/82 |

OTHER PUBLICATIONS

A. Croisier, *IBM Technical Disclosure Bulletin*, "Hot Stage," vol. 6, No. 8, Jan. 1964, p. 95.

Primary Examiner—C. L. Albritton
Attorney, Agent, or Firm—Werner W. Kleeman

[57] ABSTRACT

A liquid-cooled electrical assembly containing an arrangement for cooling at least one electrical component under current flow. In this assembly, liquid coolant flows into an inlet in the cooling arrangement and the heated-up coolant is removed through an outlet. In order to increase the power handling capacity of such an arrangement over that of known arrangements having similar dimensions, a cooler is constructed from sheet-like or layer-like cooling elements, each of which have an entrance or inlet opening and an exit or outlet opening for the liquid coolant. The cooling elements are stacked together in alternating fashion with the electrical components so that the entrance openings and exit openings of the cooling elements are in direct connection with the inlet and outlet of the whole cooler. This kind of assembly will find many preferred applications when they are constructed as resistors or power semiconductors.

19 Claims, 8 Drawing Figures

LIQUID-COOLED ELECTRICAL ASSEMBLY

BACKGROUND OF THE INVENTION

The present invention relates to a new and improved liquid-cooled electrical assembly.

Generally speaking, the liquid-cooled electrical assembly of the present development is of the type containing an arrangement for cooling at least one electric component under current. A liquid coolant flows into an inlet of a cooler and heated-up coolant is removed from the cooler through an outlet.

These types of assemblies have been known as state-of-the-art for a long time. Among these assemblies, electrical resistors deserve special mention because they have found such wide application. These resistors are generally available as wirewound resistors and have the main disadvantage that the heat produced by the current flowing through the resistance wire can only be relatively slowly carried away because of poor thermal contact between the resistance wire and the cooler. Furthermore, this thermal contact is made even poorer under ordinary operating conditions since parts of the resistance wire, for example, which were tightly wound around a central cooler in the current-free state can peel away from the cooler when it heats-up under current flow. This has the effect that some of the heat produced in the wire has to be conducted through an insulating layer of air which has formed between the wire and the cooler.

Furthermore, it is necessary to provide an insulating layer between a metallic cooler and the resistance wire. This layer is usually manufactured from pressed or sintered powder or a hardened or set casting resin. With present materials, a sufficient insulation only can be achieved with a relatively thick layer. This causes a further decrease in the thermal contact between the resistance wire and the cooler.

SUMMARY OF THE INVENTION

A primary object of the present invention is to provide an assembly of the aforementioned type which, besides having a simple construction and high reliability, is primarily characterized by a considerably increased ability to take-up power in comparison with conventional assemblies of similar dimensions.

Now in order to implement this object and others which will become more readily apparent as the description proceeds, the liquid-cooled electrical assembly of the present development is of the type wherein the cooler comprises substantially sheet-like cooling elements each having an inlet opening and an outlet opening for the coolant. These cooling elements and electric components are alternately stacked together to form a stack or pile. The inlet openings of the cooling elements are directly connected with a liquid coolant inlet of the cooler and the outlet openings of the cooling elements are directly connected with a liquid coolant outlet of the cooler.

BRIEF DESCRIPTION OF THE DRAWINGS

The above and other objects and features of the invention will become apparent from the following detailed description taken in connection with the accompanying drawings which form a part of this specification, and in which throughout the various Figures of the drawings the same reference characters have been generally used to denote the same or analogous components and wherein.

DETAILED DESCRIPTION OF THE PREFERRED EMBODIMENTS

Figure 1:
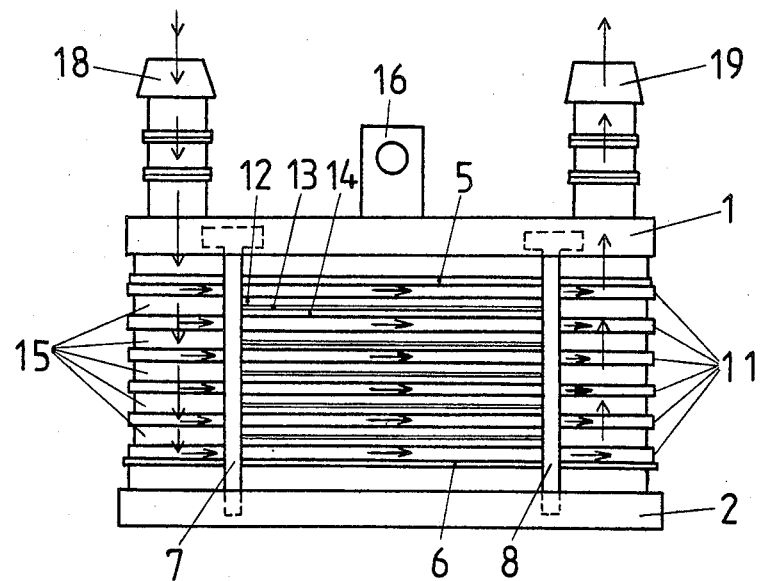
FIG. 1 is a side view of an assembly made according to this invention realized in the form of an electrical resistors.

Describing now the drawings, in FIG. 1 reference numerals 1 and 2 respectively designate the upper and lower plates of a clamping arrangement. The underside or lower face of the upper plate 1 and the upper side or face of the lower plate 2 are provided with the respective layers 5 and 6 formed of a suitable insulating and ductile material, such as plastic. Between the two plates 1 and 2 a stack of alternating cooling elements 11 and resistive elements 13 are clamped together by means of the threaded bolts or screws 7 and 8 or equivalent fastening devices. The sides of the cooling elements 11 facing the resistive elements 13 are coated with a dielectric material. This coating is designated by reference numerals 12 or 14, depending upon whether this layer lies above or below an adjacent resistive element 13. Sealing rings 15 are located below an inlet 18 and outlet 19 for the cooling liquid or coolant to the entire assembly, and are spaced between each of the cooling elements 11. These sealing rings 15 seal the entrance or inlet openings 24 and exit or outlet openings 25 (not visible in FIG. 1) which are located at each cooling element 11. Reference numeral 16 designates one of the terminals to the multi-element resistor.

Figure 2:
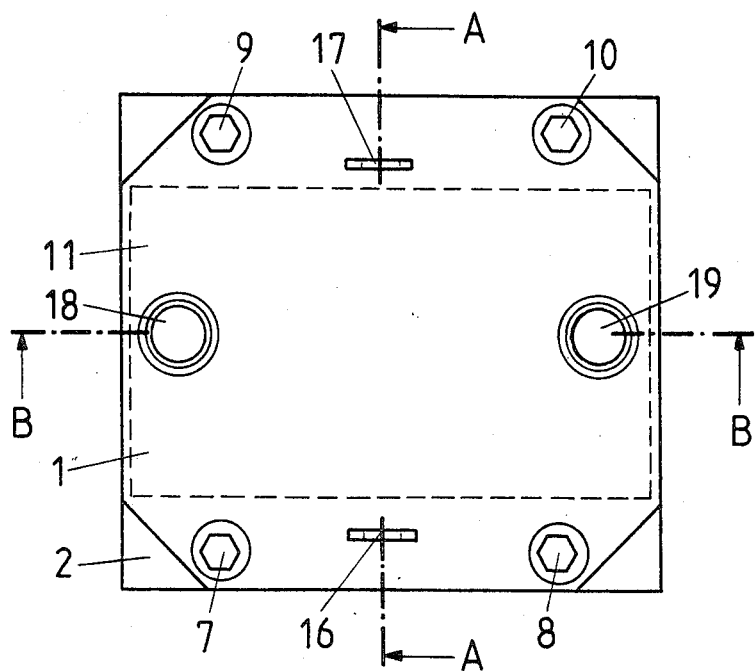
FIG. 2 is a top plan view of the resistor made according to this invention shown in FIG. 1.

FIG. 2 shows the other terminal 17 to the resistor and additional threaded bolts or screws 9 and 10 belonging to the clamping arrangement.

Figure 3:
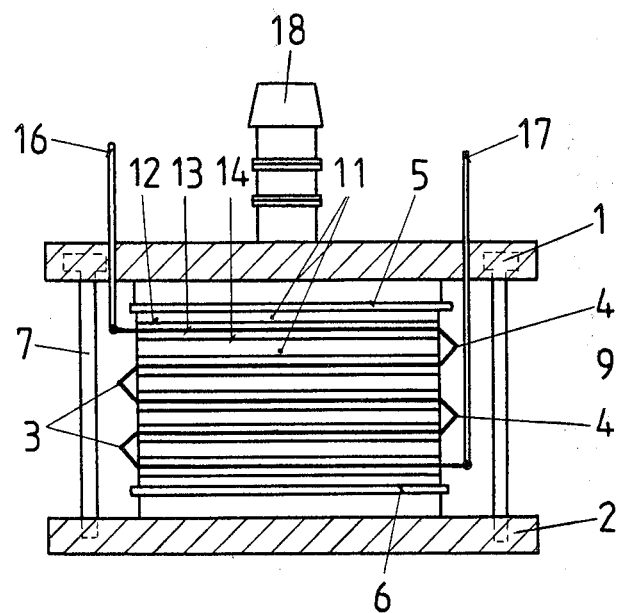
FIG. 3 is a cross-sectional view of the resistor made according to this invention and shown in FIG. 2, taken substantially along the line A—A thereof.

From FIG. 3 it can be seen that the uppermost resistive element 13 is connected to terminal 16 and the lowermost resistive element 13 is connected to terminal 17. All resistive elements 13 are connected together in a series arrangement by means of the conductors 3 and 4.

It is important that both the cooling elements 11 and the resistive elements 13 can be in the form of thin sheets or layers and that each cooling element 11 has at least one entrance or inlet opening 24 and exit or outlet opening 25 for the coolant liquid which is in direct connection or flow communication with the inlet or inlet port 18 and outlet or outlet port 19 for the coolant to the whole assembly. The sheet form of the resistive elements 13 and cooling elements 11 enables a great deal of heat to be transferred to the liquid coolant when the resistor is under load, which heat then can be carried away very quickly because the coolant flows through the cooling elements in a parallel fashion.

To further improve the thermal and/or electrical loading as well as to better withstand the pressure forces from the coolant it is recommended that the stack consisting of the cooling element 11 and resistive elements 13 be adhesively bonded together with a silicon type adhesive.

The layers of dielectric material 12 and 14 found above and below each resistive element 13 have the main job of protecting the flow of current in the resistive elements from outside disturbances. Thin layers of sintered oxide, such as beryllium oxide or aluminum oxide or layers containing mica have proven to be especially good materials for this dielectric. Also very effective are sheets of anodized aluminum which have the additional advantage, since the inner part of the layer is conducting aluminum metal, of being able to be connected to a given electrical potential without any further treatment. It has also been proven effective to combine the dielectric layers 12 and 14 with a sheet of material having a good thermal conductivity, such as copper, in order to eliminate any "hot spots" that might be generated in the resistive elements 13.

The cooling elements 11 are fashioned so that they have a large surface of thermal contact with the resistive elements 13 located above and below them. Cooling elements built like those shown in FIG. 4 have proven to be ideal. Elements of this type essentially consist of two cover plates 20 and 21 with a spacer 22 located between them. Both cover plates 20 and 21 are welded to the spacer 22 with liquid-tight seams 23. Because the cooling elements 11 generally are thinner than 3 mm in a multi-kilowatt resistor, the cooling element must be very precisely welded together. This could, for example, be carried out using a laser welding process.

Figure 4:
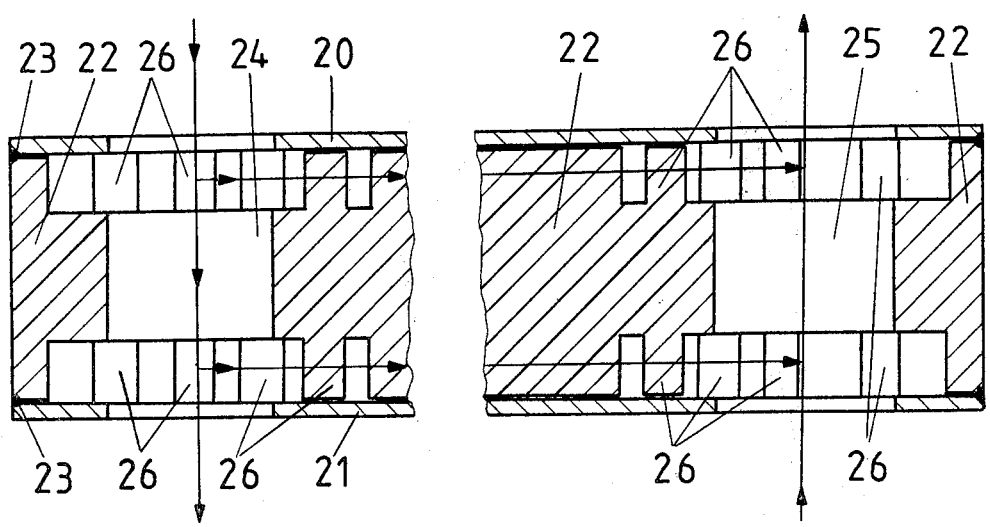
FIG. 4 is a cross-sectional view of one of the cooling elements of the resistor made according to this invention shown in FIG. 2, taken substantially along the line B—B thereof.

The cooling element illustrated in FIG. 4 has an entrance or inlet opening 24 for the coolant to flow in as shown by the arrow, and an exit or outlet opening 25 to carry off the coolant after it has been heated-up. As can be inferred from the direction of circulation of the coolant, indicated by the arrows in FIG. 1, every entrance or inlet opening 24 of each cooling element 11 is directly connected to the coolant inlet port 18 of the whole assembly and every exit opening 25 of each cooling element 11 is directly connected to the outlet port 19. The coolant flowing into the inlet opening 24 of even the lowest cooling element 11 in the stack or pile therefore has not yet taken-up any heat. Similarly, the heated-up coolant flowing out of this lower cooling element 11 does not influence the cooling elements 11 lying above it because of the direct connection of this outlet opening 25 with the outlet port 19.

The inlet or entrance openings 24 and the outlet or exit openings 25 are preferably located on opposite ends of each cooling element 11. Baffles or guide elements 26 or the like are provided near these openings 24 and 25 in order to moderate and distribute the coolant flow. As can be seen by the arrows indicating the flow direction, the incoming coolant is partially deflected in the region of the baffles 26 where it is delivered through channels 27 (not shown in FIG. 4 but illustrated in FIG. 5) to the baffles 26 at the exit or outlet opening 25. The channels 27 are located on both the upper and lower sides of the related spacer 22 and are closed on the upper side by the cover plate 20 and on the lower side by the cover plate 21. The coolant is therefore in direct thermal contact with the related cover plate, which is made of very thin stainless steel or chrome nickel steel, over a relatively long path during its flow. By virtue of this design a great deal of heat can be very quickly carried away.

Because the coolant runs along both the upper and lower cover plates 20 and 21 in every cooling element 11, there is accomplished a uniform and rapid cooling on both sides of the cooling elements 11.

Figure 5:
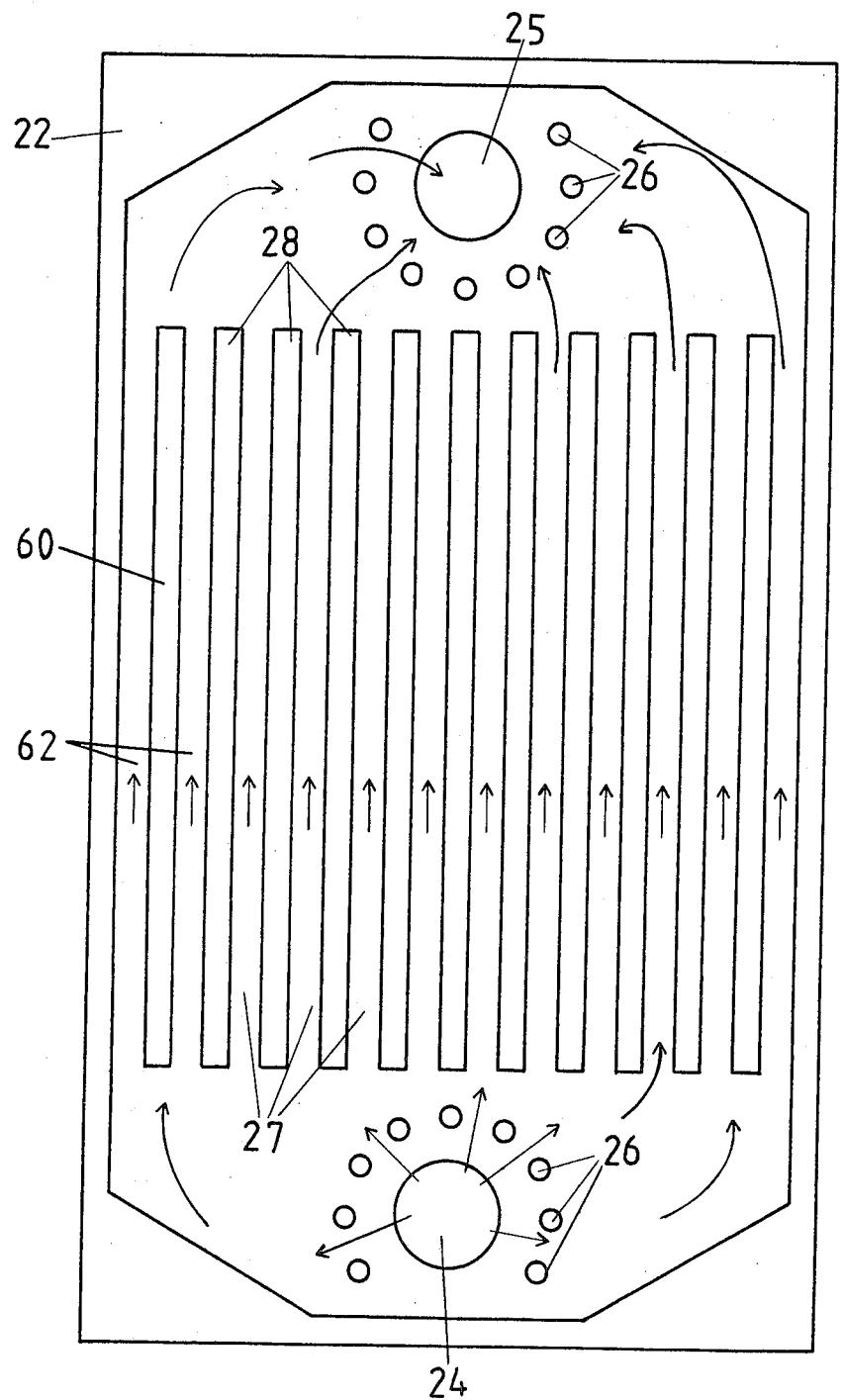
FIG. 5 is a top view of a cooling element according to FIG. 4 with the upper cover plate removed.

An example of a possible arrangement of the channels 27 is given in greater detail in FIG. 5. These channels 27 are constructed as essentially parallel recesses between longitudinal ribs 28. FIG. 5 shows only a top view of the spacer 22; similarly placed but not shown channels 27 also run on the underside of the spacer 22. The channels 27 and the baffles 26 could be produced, for example, by selectively etching the spacer or intermediate element 22. It is also recommended that the spacer or intermediate element 22 be manufactured by stacking together a series of section rolled sheets. By this means especially heavy heat flows can be withdrawn. It is also conceivable that the spacer 22 or equivalent structure could be completely eliminated and the channels 27 formed by welding flat wire on the inside of the cover plates 20 and 21. The cooling elements could then be very inexpensively produced by welding together the two cover plates 20 and 21 with only a single seam.

Figure 6:
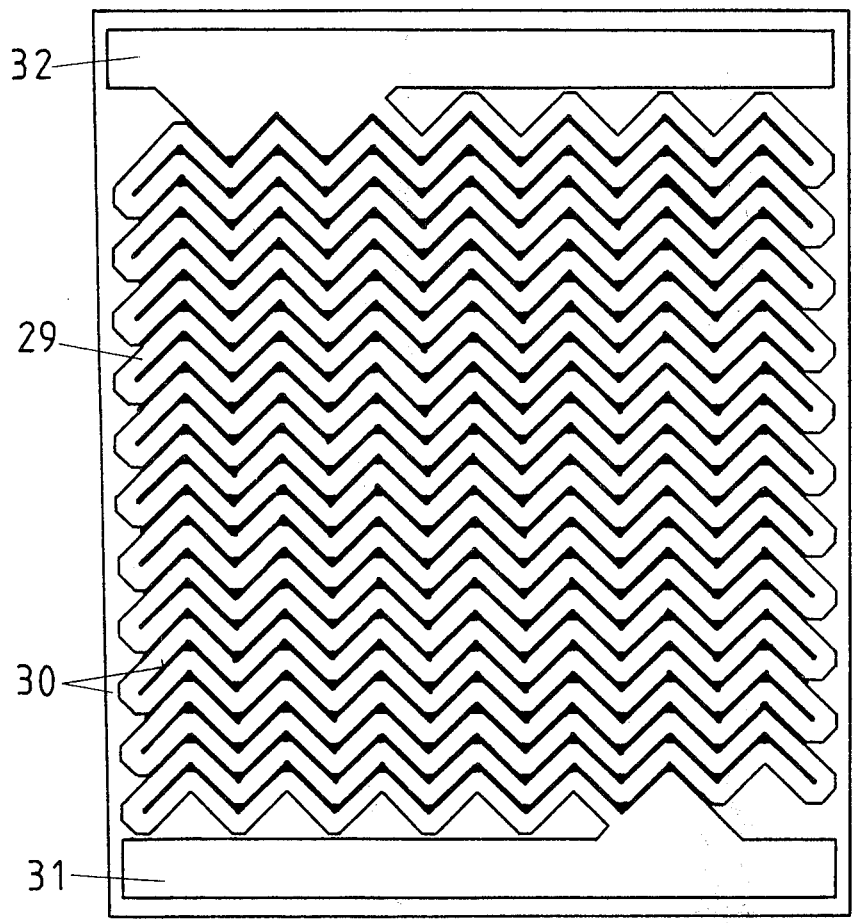
FIG. 6 is a view of one of the resistive elements of the resistor made according to this invention shown in FIG. 1.

An especially effective design of the resistance element 13 of this invention is illustrated in FIG. 6. This resistance element 13 consists of a conductive path or track 29 in the form of double-folded diagonal segments deposited on an insulating substrate foil. With this arrangement of the conducting path 29, the electromagnetic field produced by the flowing current and the heat produced by the current compensate one another in such a way that no unsymmetrical deformation of the insulating substrate can occur. Furthermore, there is only a slight inductance to this design. The conducting path 29 has contacts 31 and 32 at the two ends for connection to the current. These contacts or terminals 31 and 32 serve, as already explained in the discussion of FIG. 3, to electrically connect the individual resistive elements 13 together and to make the connection to the terminals 16 and 17 of the whole assembly.

Figure 7:
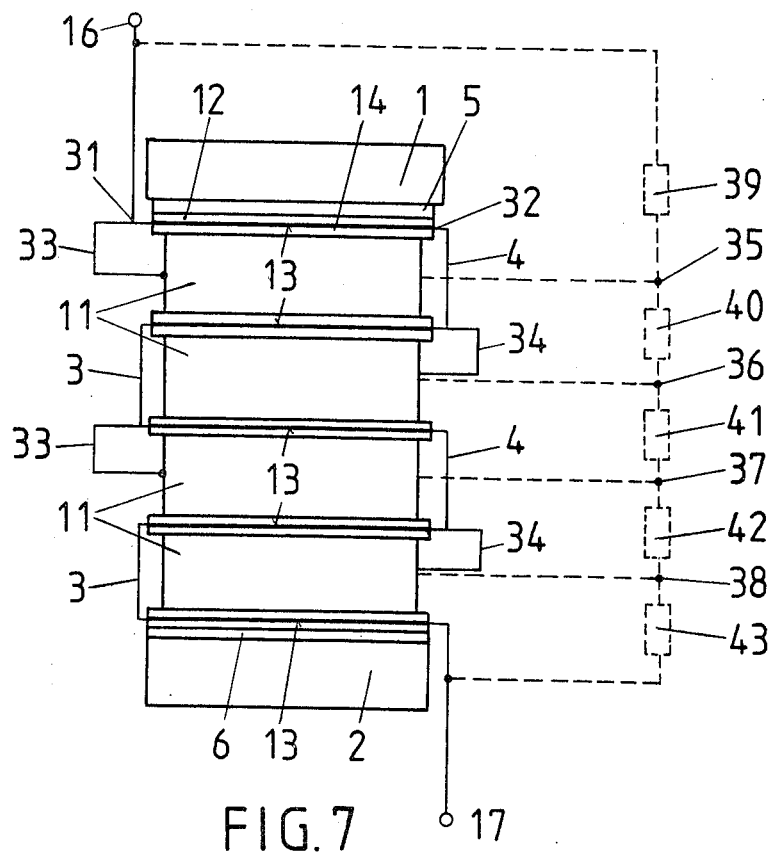
FIG. 7 is a highly schematic side view of two embodiments of the resistor made according to this invention where the cooling element is held at a defined potential.

Should the need arise, it is recommended that the cooling elements 11 be connected to defined electrical potentials. This would be necessary if static charges build up on the "floating" cooling elements and the associated glow discharges are to be avoided. FIG. 7 shows how an assembly of this invention can be designed to achieve this goal. This design can be carried out, for example, by adding the connections 33 and 34 to bring every cooling element 11 to the same potential as the contacts 31 and 32 of the adjacent resistive elements 13.

This goal can also be achieved in the manner indicated by the dotted lines in FIG. 7. In this scheme every cooling element 11 is connected to the junction point 35, 36, 37, 38 of two high-value or high-ohm resistors 39, 40, 41, 42, 43 which form a resistive voltage divider network and whose values are proportional to the resistive elements 13. These resistors 39, 40, 41, 42, 43 are high-ohmic in relation to the resistive elements 13. All resistors in the voltage divider are connected in series and the whole network is connected across the two current terminals 16 and 17 of the assembly where it divides the voltage prevailing across these points. This embodiment has the advantage of eliminating stray capacitances.

Figure 8:
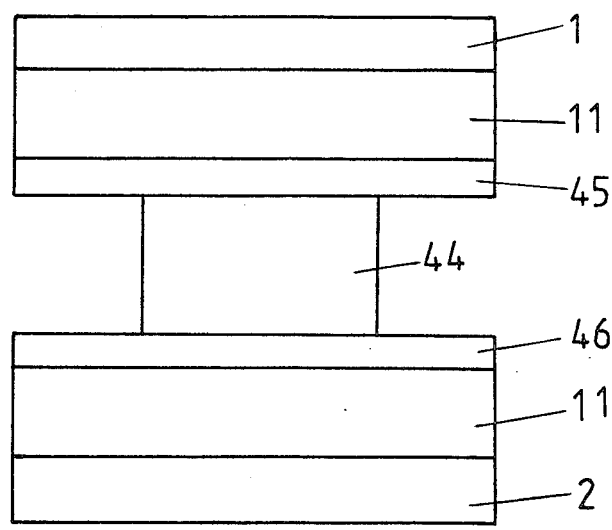
FIG. 8 is a side view of an assembly made according to this invention realized in the form of a power semiconductor.

This invention is not just limited to assemblies constructed as resistors, but extends itself to all assemblies where analogous cooling problems occur, such as, for example, in power semiconductor devices. FIG. 8 is a highly simplified schematic illustration depicting how a power semiconductor device can be constructed according to the teachings of this invention. In such FIG. 8 a semiconductor element 44 is located between two heat distributors 45 and 46 which have been provided with layer-type or sheet-like cooling elements 11. The design of this embodiment then consists of stacking cooling and semiconductor elements 11, 44 in a clamping arrangement provided with pressure plates 1 and 2. The power handling capacity of this arrangement is considerably larger than that of conventionally build assemblies having the same dimensions.

While there are shown and described present preferred embodiments of the invention, it is to be distinctly understood that the invention is not limited thereto, but may be otherwise variously embodied and practiced within the scope of the following claims. Accordingly,

What is claimed is:

1. In a liquid-cooled electrical assembly containing an arrangement for cooling at least one electrical component with current flowing through it and having a coolant liquid flowing into an inlet of a cooler and heated-up coolant removed from the cooler through an outlet, the improvement which comprises:
    the cooler comprising substantially sheet-like cooling elements each having an inlet opening and an outlet opening for the coolant;
    the cooling elements and electrical components being alternately stacked together to form a pile;
    the inlet opening of each cooling element being directly connected with a liquid coolant inlet of the cooler;
    the outlet opening of each cooling element being directly connected with a liquid coolant outlet of the cooler;
    each said inlet opening and outlet opening of each cooling element having a lengthwise axis disposed substantially perpendicular to a plane containing such cooling element; and
    said inlet openings and said outlet openings of said cooling elements mutually interconnecting said cooling elements in flow communication with one another.

2. The liquid-cooled assembly according to claim 1, wherein:
    the cooling elements and the electrical components are adhesively bonded together.

3. The liquid-cooled assembly according to claim 1, wherein:
    the cooling elements and the electrical components are held together in a clamping arrangement.

4. The liquid-cooled assembly according to claim 1, including:
    a layer of dielectric material on at least one side of the cooling elements which face the electrical components.

5. The liquid-cooled assembly according to claim 4, wherein:
    said dielectric layer is in contact with a layer of heat distributing material.

6. The liquid-cooled assembly according to claim 4, wherein:
    said dielectric layer contains at least one sintered oxide.

7. The liquid-cooled assembly according to claim 4, wherein:
    said dielectric layer contains at least mica.

8. The liquid-cooled assembly according to claim 4, wherein:
    said dielectric layer contains anodized aluminum sheet.

9. The liquid-cooled assembly according to claim 1 wherein:
    at least one said inlet opening and outlet opening are located on opposite ends of each cooling element;
    channel means for interconnecting said inlet and outlet openings; and
    baffle means provided at the region of the inlet openings and outlet openings.

10. The liquid-cooled assembly according to claim 9, wherein:
    each cooling element is provided with two cover plates and a spacer between said cover plates; and
    each said spacer being provided with longitudinal ribs.

11. The liquid-cooled assembly according to claim 10, wherein:
    said longitudinal ribs are welded to said cover plates.

12. The liquid-cooled assembly according to claim 10, wherein:
    said longitudinal ribs and baffle means are etched into a related one of said spacers.

13. The liquid-cooled assembly according to claim 10, wherein:
    each said spacer is formed from section rolled metal sheet.

14. The liquid-cooled assembly according to claim 1, wherein:
    said electrical component comprises at least one wafer of semiconducting material.

15. The liquid-cooled assembly according to claim 1, wherein:
    each said electrical component comprises at least one sheet-type resistive element constituting resistor.

16. The liquid-cooled assembly according to claim 15, wherein:
    each of said resistive elements contain conductive paths deposited on an insulating substrate in a non-inductive pattern in a current-compensating manner;
    said resistive elements having electrical contacts;
    an electrical contact of a first resistive element being connected by a welding seam located outside of the cooling element to an electrical contact of a second resistive element separated from the first one by a cooling element; and
    said cooling element being connected to a defined potential.

17. In a liquid-cooled electrical assembly containing an arrangement for cooling at least one electrical component with current flowing through it and having a coolant liquid flowing into an inlet of a cooler and heated-up coolant removed from the cooler through an outlet, the improvement which comprises:
    the cooler comprising substantially sheet-like cooling elements each having an inlet opening and an outlet opening for the coolant;

the cooling elements and electrical components being alternately stacked together to form a pile;

the inlet opening of each cooling element being directly connected with a liquid coolant inlet of the cooler;

the outlet opening of each cooling element being directly connected with a liquid coolant outlet of the cooler;

each said electrical component comprising at least one sheet-type resistive element making up a resistor;

each of said resistive elements contain conductive paths deposited on an insulating substrate in a non-inductive pattern in a current-compensating manner;

said resistive elements having electrical contacts;

an electrical contact of a first resistive element being connected by a welding seam located outside of the cooling element to an electrical contact of a second resistive element separated from the first one by a cooling element;

said cooling element being connected to a defined potential; and each cooling element is held at the same potential as the electrical contact of a neighboring resistive element.

18. In a liquid-cooled electrical assembly containing an arrangement for cooling at least one electrical component with current flowing through it and having a coolant liquid flowing into an inlet of a cooler and heated-up coolant removed from the cooler through an outlet, the improvement which comprises:

the cooler comprising substantially sheet-like cooling elements each having an inlet opening and an outlet opening for the coolant;

the cooling elements and electrical components being alternately stacked together to form a pile;

the inlet opening of each cooling element being directly connected with a liquid coolant inlet of the cooler;

the outlet opening of each cooling element being directly connected with a liquid coolant outlet of the cooler;

each said electrical component comprising at least one sheet-type resistive element making up a resistor;

each of said resistive elements contain conductive paths deposited on an insulating substrate in a non-inductive pattern in a current-compensating manner;

said resistive elements having electrical contacts;

an electrical contact of a first resistive element being connected by a welding seam located outside of the cooling element to an electrical contact of a second resistive element separated from the first one by a cooling element;

said cooling element being connected to a defined potential; and each cooling element is connected to a junction of two resistors of a resistive voltage divider network.

19. The liquid-cooled assembly according to claim 1, further including:

a respective sealing element arranged between the inlet openings and between the outlet openings of each two successive cooling elements of said pile of alternately stacked together cooling elements and electrical components.

* * * * *